Figure 1:
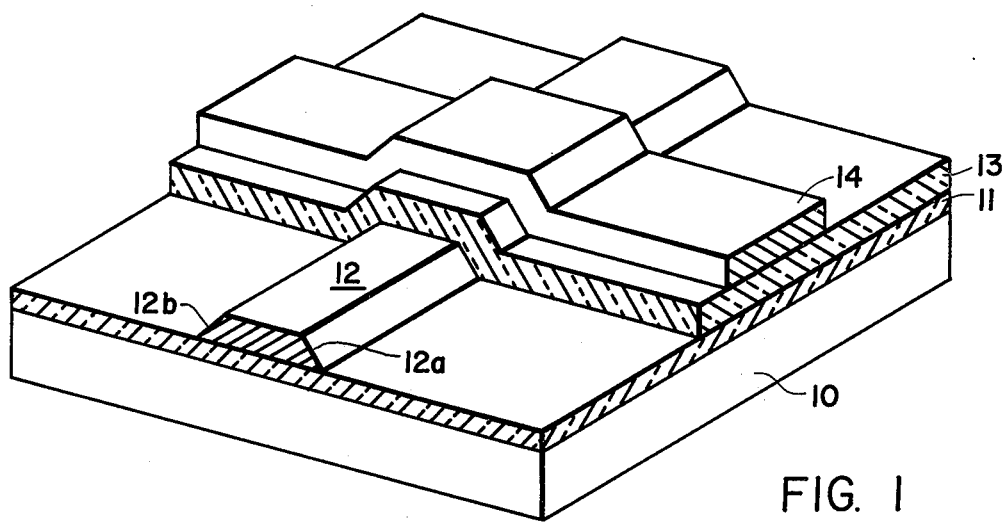

United States Patent [19]
Yanez

[11] 4,082,604
[45] Apr. 4, 1978

[54] SEMICONDUCTOR PROCESS
[75] Inventor: Richard R. Yanez, Scottsdale, Ariz.
[73] Assignee: Motorola, Inc., Schaumburg, Ill.
[21] Appl. No.: 646,317
[22] Filed: Jan. 5, 1976
[51] Int. Cl.$^2$ .............................................. C23F 1/02
[52] U.S. Cl. .................................. 156/656; 148/6.27; 148/6.3; 156/659; 156/665
[58] Field of Search ............... 156/656, 659, 665, 646; 148/6.27, 6.3; 204/38 A; 427/90

[56] References Cited
U.S. PATENT DOCUMENTS
3,825,454  7/1974  Kikuchi et al. ........................ 156/656

Primary Examiner—William A. Powell
Attorney, Agent, or Firm—Lowell E. Clark

[57] ABSTRACT

A process for improving the continuity of overlayers above an aluminum metallization stripe on a semiconductor device which includes the step of forming a conversion coating on the surface of the aluminium metallization. The conversion coating has a higher etch rate than the aluminum per se, and hence after selective masking, a tapered or sloped edge is produced on the aluminum stripe which is more easily continuously overlayed by the further necessary layers.

3 Claims, 5 Drawing Figures

U.S. Patent        April 4, 1978        4,082,604

4,082,604

SEMICONDUCTOR PROCESS

BACKGROUND OF THE INVENTION

This invention relates to the manufacture of semiconductor devices and more particularly to the manufacture of semiconductor devices such as an integrated circuit in which a multilevel metallization system is utilized.

In the manufacture of integrated circuits particularly high density integrated circuits first, second and even third layers of metallization may be utilized to form all of the interconnects between the devices contained on a single chip. With each level of metallization the problem of metal continuity, i.e., step coverage, becomes more acute. The problem of step coverage occurs when a first layer of metallization, typically of aluminum, is deposited and the metallization formed into particular stripes or patterns. The stripes obviously form ridges across the surface of the semiconductor when a layer of insulating material is deposited across the ridge. If the sides of the ridge are substantially perpendicular the insulating material may not cover completely the sides of the ridge. Thus, when a further metallization layer is deposited this metallization may come directly in contact through holes in the insulation with the underlying metallization ridge. Obviously, contact between the two metallization layers will cause an electrical short. Even if the insulation material completely covers the metal, the deposition and subsequent patterning of the overlying metallization may become discontinuous as the metallization stripe crosses the underlying ridge, in effect "breaking" at the ridge and hence causing an electrical open.

SUMMARY OF THE INVENTION

It is an object of this invention to provide tapered or sloped metallization ridges whereby step coverage is greatly improved.

It is a further object of this invention to improve step coverage in integrated circuits by sloping the edges of the underlying metallization stripes.

It is a further object of the invention to improve the step coverage of aluminum metallization stripes for integrated circuits.

In accordance with the invention there is provided a process whereby an aluminum metallization layer is deposited over an insulating layer on a semiconductor substrate. A conversion coating is formed on the surface of the aluminum metallization which conversion coating is more rapidly etched than the underlying aluminum per se. After selective masking of the aluminum metallization layer the metallization layer and the conversion coating are etched whereby the conversion coat etches more rapidly than the unconverted portion of the layer and forms a sloping edge on the unremoved aluminum layer.

THE DRAWINGS

Further objects and advantages of the invention will be understood from the following complete description thereof and from the drawings wherein:

FIG. 1 is a perspective view of a portion of an integrated circuit showing the inner section of a multilevel metallization pattern; and FIGS. 2-5 are cross-sections of a portion of an integrated circuit indicating successive steps in the manufacture thereof in accordance with the invention.

COMPLETE DESCRIPTION

In integrated circuits there are many requirements for intersecting metallization patterns, for example, in a memory matrix there may be parallel rows of address lines while having parallel columns of read lines in a pattern orthogonal to the address lines. The most common method of manufacturing such intersecting patterns is to first deposit and pattern a layer of metallization, typically aluminum, in one direction over an insulating oxide; deposit another insulating layer; and then deposit and pattern a second level of metallization. From this structure, is derived the term multi-level metallization. Thus, the underlying metallization forms ridges across the integrated circuit which must be crossed by the overlying metallization stripes. If these ridges are too abrupt as is common, there is formed a step in the overlying insulating and hence in the overlying metallization pattern. If the insulating layer does not properly cover the step the metallization pattern above contacts the metallization pattern below resulting in a short circuit. Another problem is that if the metallization pattern on top does not properly cover the step the metallization can become discontinuous over the step resulting in an electrical open.

In accordance with the invention, sloping of the underlying metallization greatly improves the continuity of the overlying oxide and metallization pattern.

As shown in FIG. 1 an intergrated circuit 10, typically of silicon, has an overlying insulating layer 11 on which a sloped metallization stripe of aluminum has been formed. A second layer 13 of insulating material covers the metallization stripe 12 and has thereon an intersecting metallization stripe 14. Since only a small portion of the integrated circuit (on a very enlarged scale) is shown no active regions or diffusions in the substrate 10 are depicted.

Figure 2:
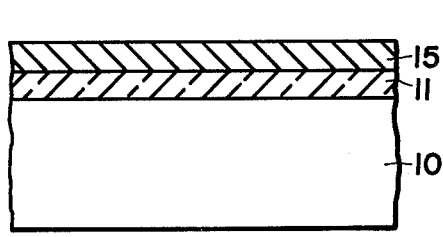
Figure 3:
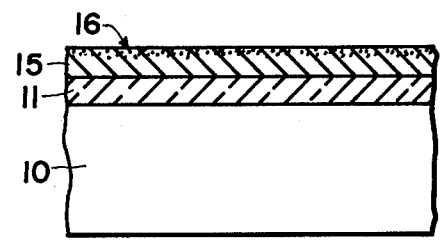
Figure 4:
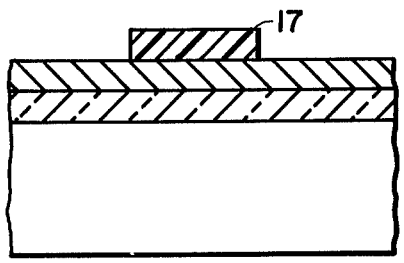

Sloping shoulders 12a and 12 b are provided in accordance with the invention by forming an oxide insulating layer 11 on the semiconductor device 10 and then depositing a metallization layer of aluminum 15 thereon (FIG. 2). A conversion coating 16 (FIG. 3) is formed on the aluminum metallization layer 15. The conversion coating layer 16 is more readily etchable than the aluminum metallization per se.

Figure 5:
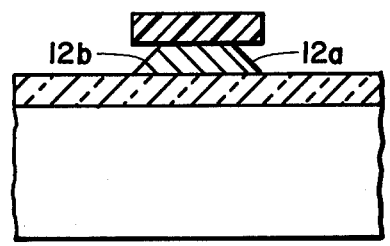

By suitable photolithographic techniques a photoresist pattern 17 (FIG. 4) is formed over the conversion coating 16 and metallization layer 15 and the semiconductor device subjected to an etching solution resulting in the structure shown in FIG. 5. Since the conversion coating 16 is more readily etchable than the aluminum per se, the material under the photoresist is more readily attacked thereby forming the sloped shoulders of the metallization stripe 12, shoulders 12a and 12b.

The conversion coating 16 is preferably formed by immersing the wafer in a fuming nitric acid bath for approximately five minutes at approximately 80° C. Following rinsing of the wafers to remove the fuming nitric acid, the wafer is immersed in boiling water for approximately fifteen minutes. It is believed, as is set forth in related application, Ser. No. 510,532 filed Sept. 30, 1974, now Pat. No. 3,986,897, and assigned to the same assignee as herein that the nitric acid oxidizes the surface of the aluminum to form $Al_2O_3$ and the boiling water treatment converts this $Al_2O_3$ to an aluminum hydroxide A10(OH), which compound is known as boehmite.

The etchant preferred for forming the sloped edges of the metallization strip following the conversion step and patterning with photoresist is the standard "B" etch which is a phosphouric acid with acetic acid as is well known.

Following deposition of a second insulating layer 13 and patterning of a second metallization layer the structure of FIG. 1 is attained.

What is claimed is:

1. In a process for producing a semiconductor integrated circuit the steps comprising:
   (a) depositing an aluminum metallization layer over an insulating layer of a semiconductor substrate,
   (b) forming a conversion coating on the surface of the aluminum metallization layer by immersing the semiconductor substrate in fuming nitric acid and then subjecting the wafer to boiling water,
   (c) selectively masking said aluminum metallization layer, and
   (d) etching said aluminum metallization whereby said conversion coating etches more rapidly than the unconverted portion of the layer and forms a sloping etch on the unremoved aluminum layer.

2. In a process as recited in claim 1 wherein said fuming nitric acid is maintained at a temperature of approximately 80° C.

3. In a process for producing a semiconductor integrated circuit the steps comprising:
   (a) depositing an aluminum conductor layer over an insulating layer on a semiconductor substrate.
   (b) forming a conversion coating on the surface of the aluminum layer by immersing the semiconductor substrate in fuming nitric acid and then subjecting the wafer to boiling water, which coating has a more rapid etch rate than the conductor layer,
   (c) selectively masking said conductor layer, and
   (d) etching said conductor layer whereby said coating etches more rapidly than the uncovered portion of the layer and forms a sloping etch on the unremoved portion of the layer.

* * * * *